United States Patent
Kiang et al.

(10) Patent No.: US 7,872,601 B2
(45) Date of Patent: Jan. 18, 2011

(54) PIPELINE ANALOG-TO-DIGITAL CONVERTER

(75) Inventors: Jean-Fu Kiang, Taipei (TW); Shan-Yung Yang, Taipei (TW)

(73) Assignee: National Taiwan University, Taipei (TW)

( * ) Notice: Subject to any disclaimer, the term of this patent is extended or adjusted under 35 U.S.C. 154(b) by 64 days.

(21) Appl. No.: 12/417,436

(22) Filed: Apr. 2, 2009

(65) Prior Publication Data

US 2010/0182182 A1 Jul. 22, 2010

(30) Foreign Application Priority Data

Jan. 17, 2009 (TW) .............................. 98101849 A

(51) Int. Cl.
 *H03M 1/12* (2006.01)
(52) U.S. Cl. ........................................ 341/155; 341/159
(58) Field of Classification Search .................. 341/161, 341/155, 144, 156

See application file for complete search history.

(56) References Cited

U.S. PATENT DOCUMENTS

| 5,629,700 | A  | * | 5/1997 | Kumamoto et al. | .......... 341/161 |
| 7,006,028 | B2 | * | 2/2006 | Galton | ........................ 341/155 |
| 7,397,409 | B2 | * | 7/2008 | Jeon et al. | .................... 341/156 |

* cited by examiner

*Primary Examiner*—Peguy JeanPierre

(57) ABSTRACT

Disclosed is a designed and implemented 12-bit 70 Msps pipeline analog-to-digital converter. Two adjacent blocks operate at opposite clock phases to reduce the chip size and power consumption. Since the opposite clock phases are designed to be provided by external devices, the timing between these two clock phases must be accurate. Note that the architecture of pipeline ADC consists of four stages, divided into two groups, wherein two adjacent stages in each group share one 3-bit flash ADC, hence only two 3-bit flash ADCs are required in this scheme. Therefore, there are 6-bit signal produced from each 3-bit flash ADC within one clock phase which consists of two opposite clock phases. And within the same period, the total output of the pipeline analog-to-digital converter would be 12-bit. From the simulation results, when the sampling rate is 70 Msps, this converter consumes 155 mW (TBV) at a ±1.8 V supply.

14 Claims, 7 Drawing Sheets

| Timing Index | CLK | $\overline{CLK}$ | $ADC_1$ o8 | $ADC_1$ o7 | $ADC_1$ o6 | $ADC_2$ o2 | $ADC_2$ o1 | $ADC_2$ o0 |
|---|---|---|---|---|---|---|---|---|
| I | 1 | 0 | | | | | | |
| II | 0 | 1 | b11 @I | b10 @I | b9 @I | | | |
| III | 1 | 0 | b8 @I | b7 @I | b6 @I | | | |
| IV | 0 | 1 | b11 @III | b10 @III | b9 @III | b5 @I | b4 @I | b3 @I |
| V | 1 | 0 | b8 @III | b7 @III | b6 @III | b2 @I | b1 @I | b0 @I |
| VI | 0 | 1 | b11 @V | b10 @V | b9 @V | b5 @III | b4 @III | b3 @III |
| VII | 1 | 0 | b8 @V | b7 @V | b6 @V | b2 @III | b1 @III | b0 @III |
| ⋮ | ⋮ | ⋮ | ⋮ | ⋮ | ⋮ | ⋮ | ⋮ | ⋮ |

2 clock cycles

Fig. 3

PIPELINE ANALOG-TO-DIGITAL CONVERTER

FIELD OF THE INVENTION

The present invention relates to analog-to-digital converter, in particularly, to high-speed pipeline analog-to-digital converter at half clock rate.

BACKGROUND OF THE INVENTION

For a long time, analog-to-digital converters (ADCs) play a critical role in scientific, industrial, medical and consuming electronic products, especially in wireless communications, audio and video processing and commercial electronic applications.

Although the analog-to-digital converters have many different types, their structure is mainly configured as parallel or flash architectures, the conversion rate is also controlled with an external clock, wherein one action is executed within one clock cycle, furthermore, the number of their output pins is determined according to their output bit number. Such a structure and design of the analog-to-digital converter not only slow down the overall operation, consuming substantial chip size, but also consume unnecessary power.

According to the above drawbacks in the prior art, the applicant uses a pipeline design to reduce the chip size, the cost and the power consumption of the analog-to-digital converter, and double its conversion rate by triggering with both the rising and falling edge of the clock, and sharing the output pins in common. Thus the invention of the case "the pipeline analog-to-digital converter" would be the best way to solve the deficiencies of conventional means.

SUMMARY OF THE INVENTION

The object of the present invention is to provide a pipeline analog-to-digital converter, which is configured as a four-stage circuit sharing the output pins in common. Additionally, each stage circuit of the pipeline analog-to-digital converter is simultaneously triggered by the clock and counter clock at the same time. Thus, the present invention can effectively double the conversion rate and reduce the overall circuit size and power consumption.

According to the foregoing object of the present invention, there is provided an analog-to-digital converter which provides four stages of digital signal output given an analog signal input. The analog-to-digital converter includes an input terminal receiving the analog signal input and a 2-level and 4-stage circuit having a clock and a counter clock, which simultaneously using the clock and the counter clock to control the operation of the analog-to-digital converter and sequentially converting the analog signal input into four stages of digital signal output under the control of the clock and the counter clock.

Preferably, the four stages of digital signal output form a 12-bit digital signal output and the 2-level and 4-stage circuit includes a first level circuit receiving a first stage analog signal input to provide a first and a second stage of digital signal outputs, and a second level circuit to provide a third stage and a fourth stage digital signal outputs according to the third stage of analog signal input.

Preferably, the first level circuit includes a first stage sample-and-hold circuit to receive the first stage analog signal input to provide a first stage sample-and-hold output signal, a first 3-bit flash analog-to-digital converter to provide the first stage and the second stage of digital signal outputs according to the first stage and a second stage sample-and-hold output signals, a first 3-bit multiple digital-to-analog converter to provide a second stage of analog signal input according to the first stage sample-and-hold output signal and the first stage digital signal output, a second stage sample-and-hold circuit to receive the second stage analog signal input to provide the second stage sample-and-hold output signal, and a second 3-bit multiple digital-to-analog converter to provide a third stage analog signal input according to the second stage sample-and-hold output signal and the second stage digital signal output.

Preferably, the second level circuit includes a third stage sample-and-hold circuit to receive the third stage analog signal input to provide a third stage sample-and-hold output signal, a second 3-bit flash analog-to-digital converter to provide the third and the fourth stages of digital signal outputs according to the third stage and a fourth stage sample-and-hold output signals, a third 3-bit multiple digital-to-analog converter to provide a fourth stage analog signal input according to the third stage sample-and-hold output signal and the third stage digital signal output, and a fourth stage sample-and-hold circuit to receive the fourth stage analog signal input to provide the fourth stage sample-and-hold output signal.

Preferably, the first level circuit further includes a first switch, a second switch, a third switch, a fourth switch, a first counter clock input terminal coupled to the counter clock, a first clock input terminal coupled to the clock and a first output terminal, and the first switch and the second switch are controlled via the first counter clock input terminal, and the third switch and the fourth switch are controlled via the first clock input terminal, and the first output terminal is a 3-bit output pin and outputs a 6-bit digital signal output during each of a clock and a counter clock periods.

Preferably, the second level circuit further comprises a fifth switch, a sixth switch, a seventh switch, a second counter clock input terminal clocked by the counter clock, a second clock input terminal clocked by the clock and a second output terminal, and the fifth switch and the sixth switch are controlled via the second counter clock input terminal, and the seventh switch is controlled via the second clock input terminal.

and the second output terminal is a 3-bit output pin and outputs a 6-bit digital signal output during each of a clock and a counter clock periods.

Preferably, the analog-to-digital converter is a pipeline analog-to-digital converter.

Preferably, the 2-level and 4-stage circuit further comprises a first level circuit having a first switch, a second switch, a third switch, a fourth switch, a first counter clock input terminal coupled to the counter clock, a first clock input terminal coupled to the clock and a first output terminal.

Preferably, the first switch and the second switch are controlled via the first counter clock input terminal, the third switch and the fourth switch are controlled via the first clock input terminal, and the first output terminal is a 3-bit output pin and outputs a 6-bit digital signal output during each of a clock and a counter clock periods.

Preferably, the 2-level and 4-stage circuit further comprises a second level circuit having a fifth switch, a sixth switch, a seventh switch, a second counter clock input terminal clocked by the counter clock, a second clock input terminal clocked by the clock and a second output terminal.

Preferably, the fifth switch and the sixth switch are controlled via the second counter clock input terminal, the seventh switch is controlled via the second clock input terminal, and the second output terminal is a 3-bit output pin and outputs a 6-bit digital signal output during each of a clock and a counter clock periods.

According to the foregoing object of the present invention, there is provided an analog-to-digital converter including a 2-level and 4-stage circuit having a clock and a counter clock, simultaneously using the clock and the counter clock to control the operation of the analog-to-digital converter and converting an analog signal input into a 4-stage digital signal output under a control of the clock and the counter clock.

Preferably, the 4-stage digital signal output is a 12-bit digital signal output.

According to the foregoing object of the present invention, there is provided an analog-to-digital converter including a circuit clocked by a first clock and a second clock to convert an analog signal input into a multi-stage digital output.

Preferably, the multi-stage is 4-stage.

The foregoing and other features and advantages of the present invention will be more clearly understood through the following descriptions with reference to the drawings, wherein:

BRIEF DESCRIPTION OF THE DRAWINGS

FIG. 3 is a timing diagram for the overall output bits, wherein the conversion time for one sample is 2 clock cycles.

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
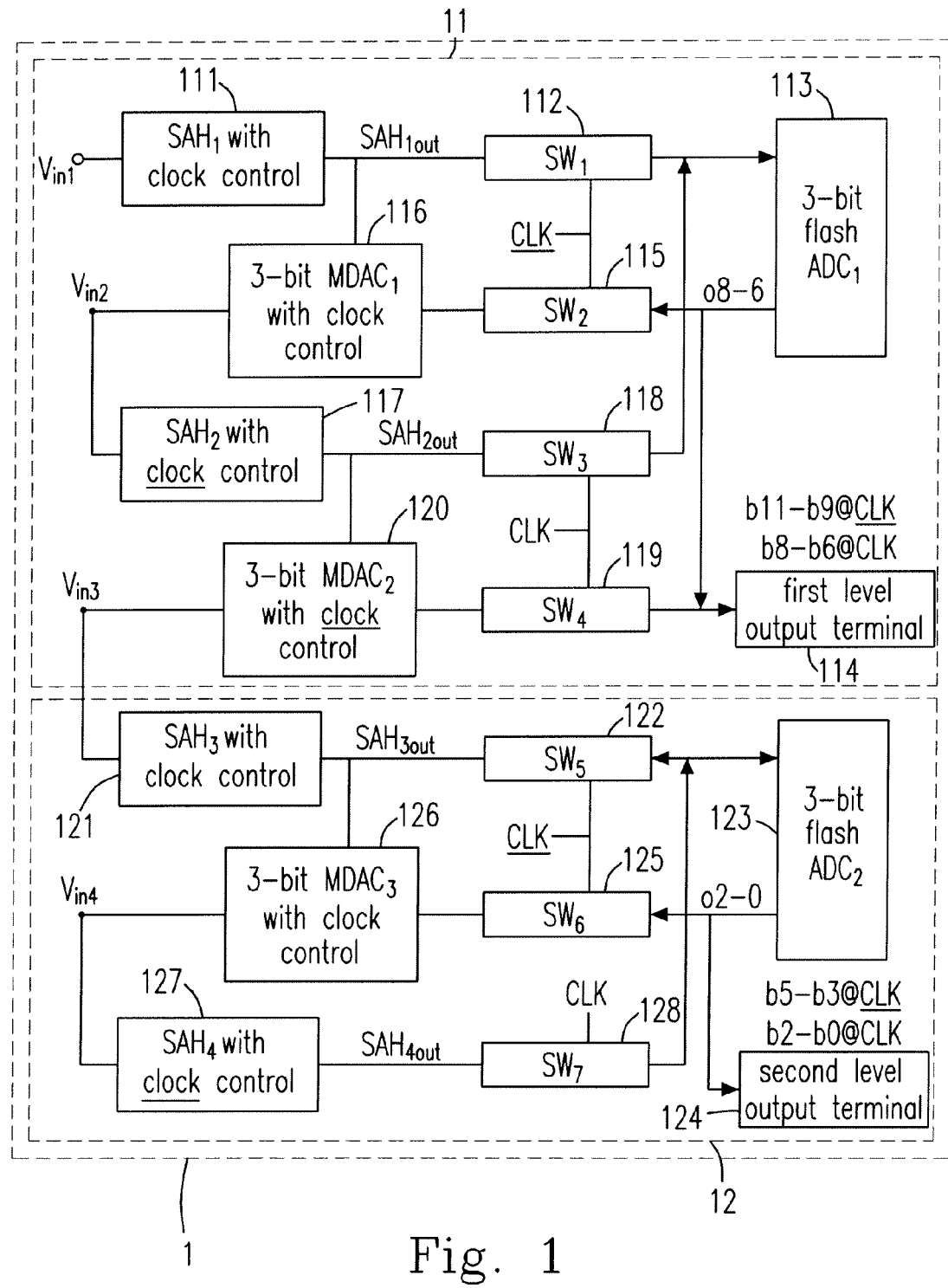
FIG. 1 is a block diagram of a 12-bit pipeline analog-to-digital converter.

Please refer to FIG. 1, which is a block diagram of a 12-bit pipeline analog-to-digital converter. In FIG. 1 the pipeline analog-to-digital converter 1 includes a first level pipeline analog-to-digital converter 11 and a second level pipeline analog-to-digital converter 12. The first level pipeline analog-to-digital converter 11 includes a first sample-and-hold circuit ($SAH_1$) with clock control 111, a first switch ($SW_1$) 112, a first 3-bit flash analog-to-digital converter ($ADC_1$) 113, a first-level output terminal 114, a second switch ($SW_2$) 115, a first 3-bit multiplexing digital-to-analog converter ($MDAC_1$) with clock control 116, a second sample-and-hold circuit ($SAH_2$) with counter clock control 117, a third switch ($SW_3$) 118, a fourth switch ($SW_4$) 119, a second 3-bit multiplexing digital-to-analog converter ($MDAC_2$) with counter clock control 120. The second level pipeline analog-to-digital converter 12 includes a third sample-and-hold circuit ($SAH_3$) with clock control 121, a fifth switch ($SW_5$) 122, a second 3-bit flash analog-to-digital converter ($ADC_2$) 123, a second level output terminal 124, a sixth switch ($SW_6$) 125, a third 3-bit multiplexing digital-to-analog converter ($MDAC_3$) with clock control 126, a fourth sample-and-hold circuit ($SAH_4$) with counter clock control 127, a seventh switch ($SW_7$) 128.

In a typical implementation, the first input signal $V_{in1}$ is first fed into the first sample-and-hold circuit ($SAH_1$) with clock control 111. The $SAH_1$ with clock control 111 output signal $SAH_{1out}$ is fed through the first switch ($SW_1$) 112 into the first level 3-bit flash $ADC_1$ 113 when counter clock goes high, and the first 3-bit multiplexing digital-to-analog converter ($MDAC_1$) with clock control 116. The first 3-bit $MDAC_1$ with clock control 116 is also fed by the first level 3-bit flash $ADC_1$ 113 with output signal o8-6 through the second switch ($SW_2$) 115 when the counter clock goes high. The first 3-bit $MDAC_1$ with clock control 116 output signal $V_{in2}$ is fed into the second sample-and-hold circuit ($SAH_2$) with counter clock control 117. Then, the $SAH_2$ with counter clock control 117 output signal $SAH_{2out}$ is fed through the third switch ($SW_3$) 118 into the first level 3-bit flash $ADC_1$ 113 when the clock goes high, and the second 3-bit $MDAC_2$ with counter clock control 120. The second 3-bit $MDAC_2$ with counter-clock control 120 output signal $V_{in3}$ is fed into the third sample-and-hold circuit ($SAH_3$) with clock control 121. Then, the $SAH_3$ with clock control 121 output signal $SAH_{3out}$ is fed through fifth switch ($SW_5$) 122 into the second level 3-bit flash $ADC_2$ 123 when counter clock goes high, and the third 3-bit $MDAC_3$ with clock control 126. The third 3-bit $MDAC_3$ with clock control 126 is also fed by the second level 3-bit flash $ADC_2$ 123 with output signal o2-0 through sixth switch ($SW_6$) 125 when the counter clock goes high. The third 3-bit $MDAC_3$ with clock control 126 output signal $V_{in4}$ is fed into the fourth sample-and-hold circuit ($SAH_4$) with counter clock control 127. Then, the $SAH_4$ with counter clock control 127 output signal $SAH_{4out}$ is fed through seventh switch ($SW_7$) 128 into the second level 3-bit flash $ADC_2$ 123 when clock goes high. Note that two adjacent stages share one flash ADC, and only two 3-bit flash ADCs are required in this scheme.

Figure 2:
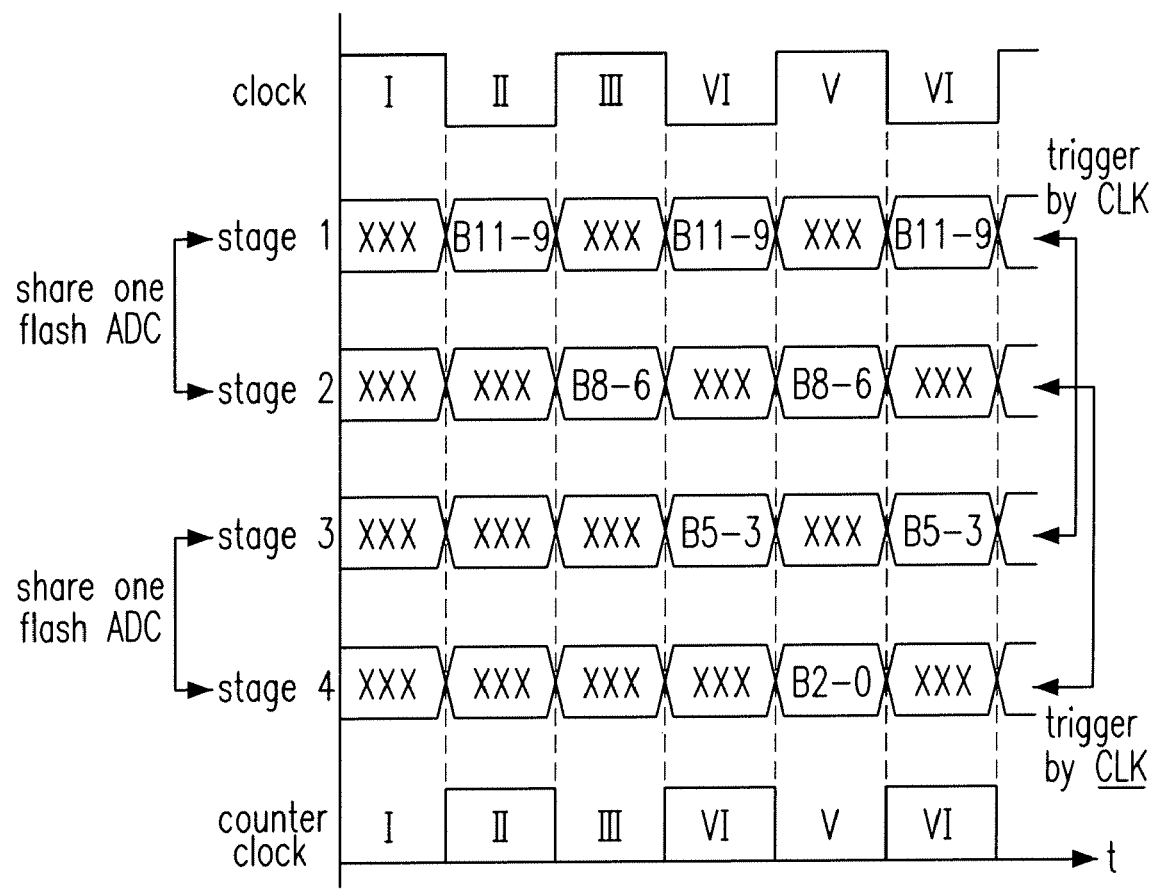
FIG. 2 is a timing diagram showing the four-stage conversions of the pipeline analog-to-digital converter.

Please refer to FIG. 2, which is a timing diagram showing the four-stage conversions of the pipeline analog-to-digital converter. FIG. 2 shows the horizontal-axis representing the time t, the vertical-axis representing the signal output of each stage of the pipeline analog-to-digital converter. In FIG. 2, the first and second stage circuits share a first stage flash analog-to-digital converter (ADC), the third and fourth stage circuits share a second stage flash analog-to-digital converter (flash ADC), wherein the first and third stage circuit are triggered by a clock, the second and fourth stage circuit are triggered by a counter clock.

Please refer to FIG. 3, which is a timing diagram for the overall output bits, wherein the conversion time for one sample is 2 clock cycles. In FIG. 3, the vertical-axis represents the timing, the horizontal-axis represents the output bit data of the pipeline analog-to-digital converter. In FIG. 3, the output signals o8-6 of flash ADC1 contain the most significant six bits b11-b6. Tie signals o8-6 represent b11-b9 and b8-b6 when the clock goes low and high, respectively. Similarly, the output signals o2-0 of flash ADC2 contain the least significant six bits b5-b0. The signals o2-0 represent b5-b3 and b2-b0 when the clock goes low and high, respectively. Since the conversion process is compressed in the time domain, the conversion time for one sample is only two clock cycles, and the output pins are reduced from twelve to six.

Figure 4A:
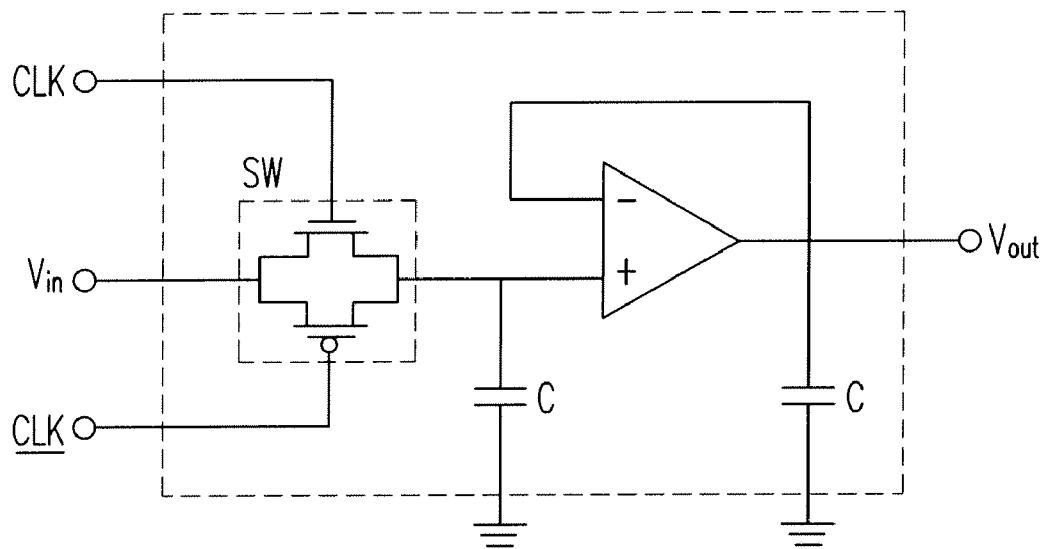
FIG. 4(a) is a schematic diagram of the sample-and-hold amplifier with clock control.
Figure 4B:
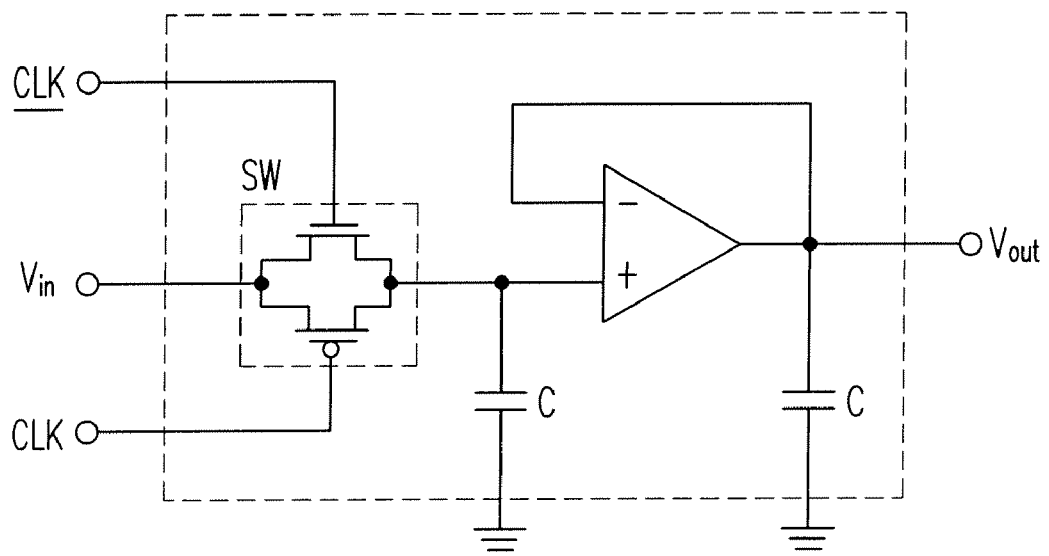
FIG. 4(b) is a schematic diagram of the sample-and-hold amplifier with counter-clock control.

Please refer to FIG. 4, which is a schematic diagram of the sample-and-hold amplifier with clock control. When the clock goes high, the switch (SW) is on and the output voltage will be equal to the input voltage. On the other hand, when the clock goes low, the switch is off, and the output voltage will stay at the voltage level before the clock goes low. FIG. 4(b) is a schematic diagram of the sample-and-hold amplifier with counter-clock control. The output voltage will follow the input voltage when the clock goes low, and hold the voltage level when the clock goes high.

Figure 5:
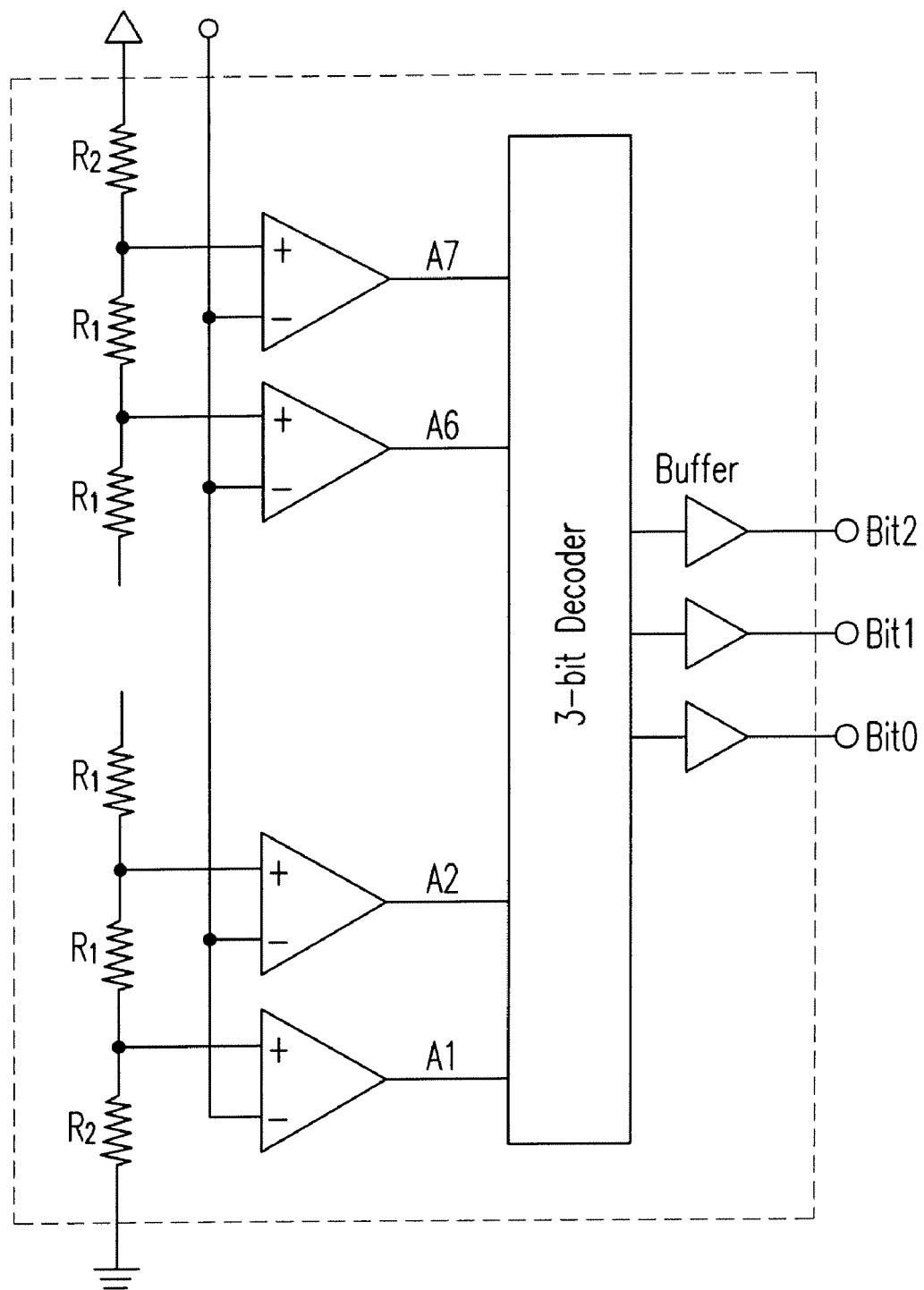
FIG. 5 is a schematic diagram of the 3-bit flash analog-to-digital converter.
Figure 6A:
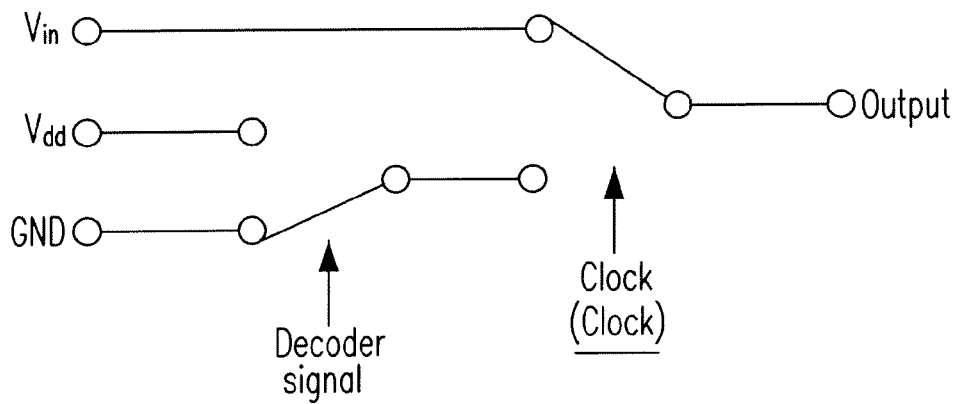
FIG. 6(a) is a block diagram of the half-bit multiplexing digital-to-analog converter with clock (counter-clock) control.
Figure 6B:
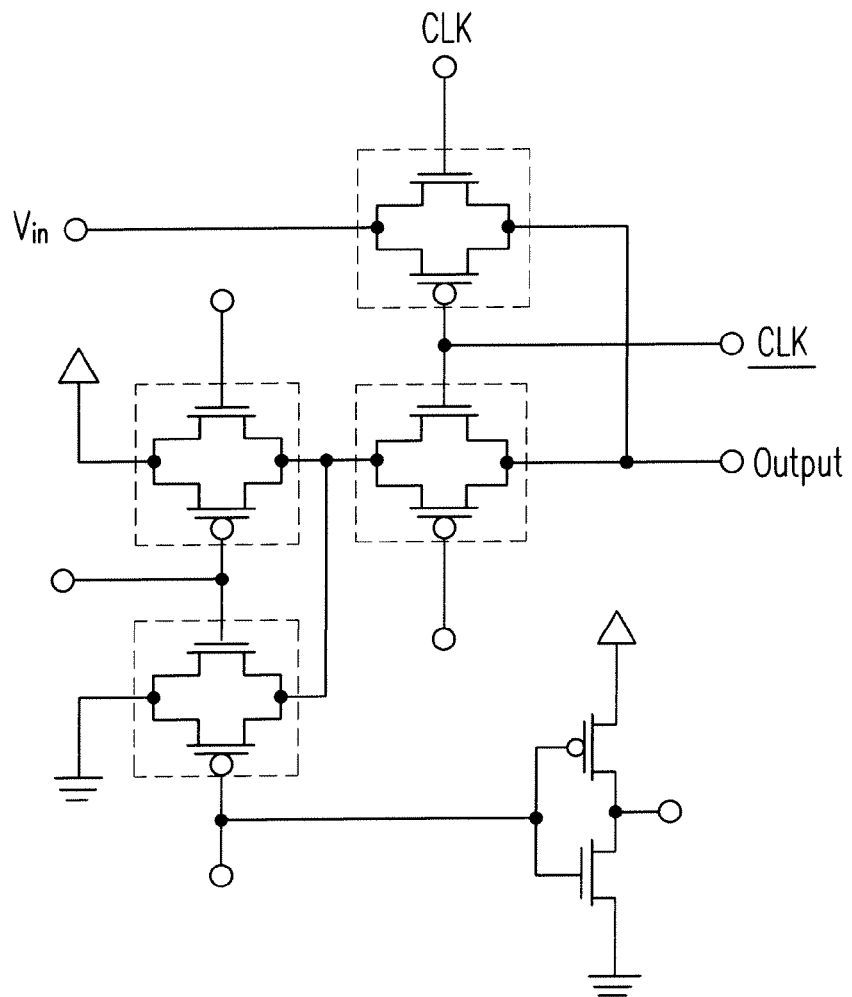
FIG. 6(b) is a conventional circuit diagram of the half-bit multiplexing digital-to-analog converter with clock (counter-clock) control.
Figure 6C:
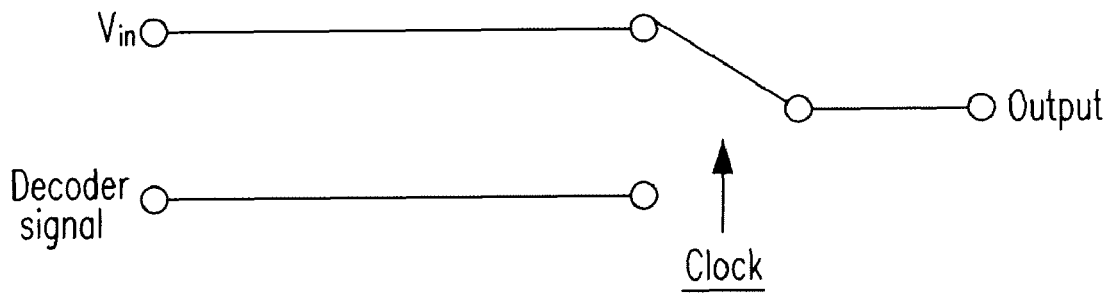
FIG. 6(c) is a simplified block diagram of the half-bit multiplexing digital-to-analog converter with clock (counter-clock) control.
Figure 6D:
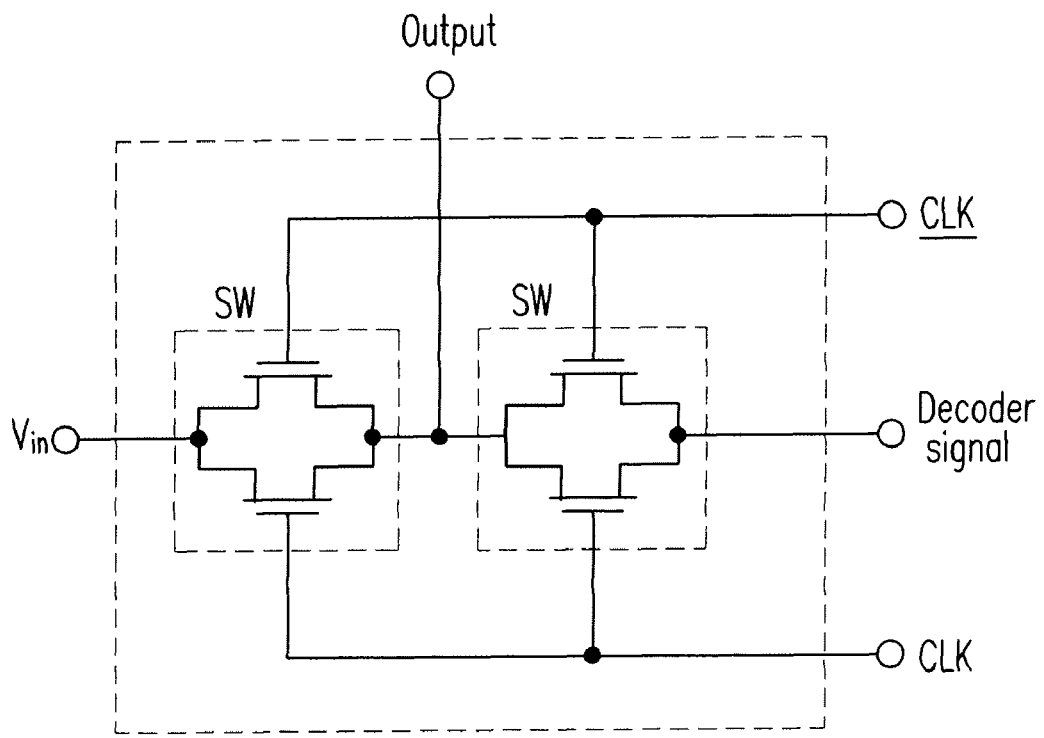
FIG. 6(d) is a simplified circuit diagram of the half-bit multiplexing digital-to-analog converter with clock (counter-clock) control.

Please refer to FIG. 5, which is a schematic diagram of the 3-bit flash analog-to-digital converter. The 3-bit flash ADC utilizes 8 resisters and 7 comparators to compare the input signal level with each of the quantization levels. The outputs of the comparators are processed by a decoder to generate the three bits as an output digital word. The complete conversion can be accomplished within half a clock cycle.

Please refer to FIG. 6, which is a block diagram of the half-bit multiplexing digital-to-analog converter with clock (counter-clock) control. FIG. 6(b) is a conventional circuit diagram of the half-bit multiplexing digital-to-analog converter with clock (counter-clock) control. FIG. 6(c) is a simplified block diagram of the half-bit multiplexing digital-to-analog converter with clock (counter-clock) control. FIG. 6(d) is a simplified circuit diagram of the half-bit multiplexing digital-to-analog converter with clock (counter-clock) control.

In summary, the present invention in the initial state requires two clock cycles to complete a conversion of an input analog sample, within each one clock cycle (including a clock and a counter clock), wherein the first level output terminal outputs a 6-bit (b11, b10, b9, b8, b7, b6) digital signals, the second level output terminal outputs a 6-bit (b5, b4, b3, b2, b1, b0) digital signals. Therefore, the same conversion using the present invention can be realized at half a clock rate, which is also the most significant feature.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. An analog-to-digital converter providing a 4-stage digital signal output according to an analog signal input and comprising:
   an input terminal receiving the analog signal input; and
   a 2-level and 4-stage circuit having a clock and a counter clock, simultaneously using the clock and the counter clock to control an operation of the analog-to-digital converter and sequentially converting the analog signal input into the 4-stage digital signal output under the control of the clock and the counter clock,
   wherein the 4-stage digital signal output is a 12-bit digital signal output and the 2-level and 4-stage circuit further comprises:
   a first level circuit receiving a first stage analog signal input to provide a first and a second stage digital signal outputs and comprising:
   a first stage sample-and-hold circuit receiving the first stage analog signal input to provide a first stage sample-and-hold output signal;
   a first 3-bit flash analog-to-digital converter to provide the first stage and the second stage digital signal outputs according to the first stage and a second stage sample-and-hold output signals;
   a first 3-bit multiple digital-to-analog converter to provide a second stage analog signal input according to the first stage sample-and-hold output signal and the first stage digital signal output;
   a second stage sample-and-hold circuit to receiving the second stage analog signal input to provide the second stage sample-and-hold output signal; and
   a second 3-bit multiple digital-to-analog converter providing a third stage analog signal input according to the second stage sample-and-hold output signal and the second stage digital signal output; and
   a second level circuit providing a third stage and a fourth stage digital signal outputs according to the third stage analog signal input and comprising:
   a third stage sample-and-hold circuit receiving the third stage analog signal input to provide a third stage sample-and-hold output signal;
   a second 3-bit flash analog-to-digital converter providing the third and the fourth stage digital signal outputs according to the third stage and a fourth stage sample and hold output signals;
   a third 3-bit multiple digital-to-analog converter providing a fourth stage analog signal input according to the third stage sample-and-hold output signal and the third stage digital signal output; and
   a fourth stage sample-and-hold circuit receiving the fourth stage analog signal input to provide the fourth stage sample-and-hold output signal.

2. An analog-to-digital converter according to claim 1, wherein the first level circuit further comprises a first switch, a second switch, a third switch, a fourth switch, a first counter clock input terminal coupled to the counter clock, a first clock input terminal coupled to the clock and a first output terminal.

3. An analog-to-digital converter according to claim 2, wherein the first switch and the second switch are controlled via the first counter clock input terminal.

4. An analog-to-digital converter according to claim 2, wherein the third switch and the fourth switch are controlled via the first clock input terminal.

5. An analog-to-digital converters according to claim 2, wherein the first output terminal is a 3-bit output pin and outputs a 6-bit digital signal output during each of a clock and a counter clock periods.

6. An analog-to-digital converter according to claim 1, wherein the second level circuit further comprises a fifth switch, a sixth switch, a seventh switch, a second counter clock input terminal clocked by the counter clock, a second clock input terminal clocked by the clock and a second output terminal.

7. An analog-to-digital converter according to claim 6, wherein the fifth switch and the sixth switch are controlled via the second counter clock input terminal.

8. An analog-to-digital converter according to claim 6, wherein the seventh switch is controlled via the second clock input terminal.

9. An analog-to-digital converter according to claim 6, wherein the second output terminal is a 3-bit output pin and outputs a 6-bit digital signal output during each of a clock and a counter clock periods.

10. An analog-to-digital converter according to claim 1, wherein the analog-to-digital converter comprises a pipeline analog-to-digital converter.

11. An analog-to-digital converter according to claim 1, wherein the 2-level and 4-stage circuit further comprises a first level circuit having a first switch, a second switch, a third switch, a fourth switch, a first counter clock input terminal coupled to the counter clock, a first clock input terminal coupled to the clock and a first output terminal.

12. An analog-to-digital converter according to claim 11, wherein the first switch and the second switch are controlled via the first counter clock input terminal, the third switch and the fourth switch are controlled via the first clock input terminal, and the first output terminal is a 3-bit output pin and outputs a 6-bit digital signal output during each of a clock and a counter clock periods.

13. An analog-to-digital converter according to claim 1, wherein the 2-level and 4-stage circuit further comprises a second level circuit having a fifth switch, a sixth switch, a seventh switch, a second counter clock input terminal clocked by the counter clock, a second clock input terminal clocked by the clock and a second output terminal.

14. An analog-to-digital converter according to claim 13, wherein the fifth switch and the sixth switch are controlled via the second counter clock input terminal, the seventh switch is controlled via the second clock input terminal, and the second output terminal is a 3-bit output pin and outputs a 6-bit digital signal output during each of a clock and a counter clock periods.

* * * * *